(12) United States Patent
Ho et al.

(10) Patent No.: US 6,849,955 B2
(45) Date of Patent: Feb. 1, 2005

(54) HIGH DENSITY INTEGRATED CIRCUIT PACKAGES AND METHOD FOR THE SAME

(75) Inventors: Kwun Yao Ho, Taipei (TW); Moriss Kung, Taipei (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 10/396,330

(22) Filed: Mar. 26, 2003

(65) Prior Publication Data

US 2004/0046264 A1 Mar. 11, 2004

(30) Foreign Application Priority Data

Sep. 9, 2002 (TW) ........................................ 91120513 A

(51) Int. Cl.[7] .............................................. H01L 23/48
(52) U.S. Cl. ..................... 257/778; 257/738; 257/773; 257/795; 257/787; 257/780; 257/783
(58) Field of Search ................................ 257/100, 433, 257/434, 667, 687, 459, 767–796, 676, 738

(56) References Cited

U.S. PATENT DOCUMENTS

| | | | | |
|---|---|---|---|---|
| 5,194,137 A | * | 3/1993 | Moore et al. ............... | 205/125 |
| 5,399,898 A | * | 3/1995 | Rostoker ..................... | 257/499 |
| 6,100,596 A | * | 8/2000 | Daly et al. .................. | 257/779 |
| 6,140,707 A | * | 10/2000 | Plepys et al. ............... | 257/778 |
| 6,507,119 B2 | * | 1/2003 | Huang et al. ............... | 257/778 |
| 6,515,360 B2 | * | 2/2003 | Matsushima et al. ....... | 257/704 |

* cited by examiner

Primary Examiner—David Nelms
Assistant Examiner—Andy Huynh
(74) Attorney, Agent, or Firm—Nath & Associates PL; Harold L. Novick

(57) ABSTRACT

The present invention relates to a structure of a high-density flip-chip integrated circuit package and a method for the same. At first, traces and a plural of solder pads are formed on a surface of a substrate simultaneously, wherein a height of the traces is as same as a height of the solder pads. Before adhering solder bumps of the chip to the solder pads, the solder bumps are dipped by using a flux at first and then the chip is connected to the substrate by using a underfill mode to avoid over-wetting defects in the reflow process. At last, the substrate and the chip are covered by using molding underfill to protect traces directly.

7 Claims, 5 Drawing Sheets

HIGH DENSITY INTEGRATED CIRCUIT PACKAGES AND METHOD FOR THE SAME

BACKGROUND OF THE INVENTION

1. Field of the Invention

The present invention relates to a high density integrated circuit packages and the method for forming the same, and more particularly to a high density integrated circuit flip chip packages and the method for forming the same.

2. Description of the Related Art

Integrated circuit package technologies are continually developed toward demands of micro-size and high integration in the integrated circuit industrial sector. The improvements focus on the integration of millions of transistors, devices and circuits on a silicon substrate.

Through a serious of precise and fine-tune processes such as etching, implantation, deposition and dicing in various processing equipments, integrated circuits are formed on wafers. Each processed wafer includes a plurality of chips and each chip can be packaged by a surrounding molding compound and connect to outside via pins. Package examples include a M dual-in-line package (M-dip) having two rows of pins connecting the chip and a printed circuit board (PCB) through the bottom of the package structure. Other package examples for high density PCB include a single-in-line package (SIP) and a small outline J-leaded package (SOJ).

Integrated circuit package can be sorted by chip number in a package assembly. A single chip package (SCP) and a multichip package (MCP) are two major sorts and the MCP includes a multichip module (MCM). Integrated circuit package can also be sorted by mounting types which comprise a pin-through-hole (PTH) type and a surface mount technology (SMT). The pins of the PTH type could be thin pins or thin metal plates. The thin pins or the thin metal plates are inserted and joint mounting into vias of a PCB when the chip is mounted. Chips with SMT packages are adhered on a PCB and then are soldered during mounting. In order to reduce the volume of an integrated circuit package and increase the integration of the chip, a more advanced direct chip attach (DCA) package is applied. The DCA package technology mounts an integrated circuit chip on a substrate directly and then completes the electrical connection.

Wire-bonding packages are most commonly used at present time. Firstly, a chip is mounted on a lead frame. Then bonding wires are utilized to connect the chip and the lead frame, and a molding compound is applied to cover the chip and portions of the lead frame to complete the package. The lead frame with the chip is attached and mounted on a substrate such as a printed circuit board (PCB) to connect circuits of the chip and the PCB. However, since the wire-bonding package technologies are limited to the package size, flip chip package technologies are developed to meet the requirements of size shrinking. First of all, the flip chip package technologies mount chips having solder bumps thereon on a substrate. Then an underfill material is filled into the space between the chips and the substrate to protect the joint connections and the chips. The size of the flip chip packages can be further minimized without using any lead frame. Nevertheless, since the flip chip package technologies use solder masks to protect circuit traces on a package substrate from short circuit stemming from the contact between solder bumps and the circuit traces, several drawbacks such as misalignment resulting from the solder masks during the bonding of chips and the substrate via solder bumps are still to be overcame.

Conventional flip chip packages comprise solder mask defined (SMD) and non-solder mask defined (NSMD) flip chip packages. Referring to FIG. 1, a chip is mounted on a substrate by SMD and underfilling. The package structure in FIG. 1 includes a substrate 10 having circuit traces 25, bump pads 20 and a solder mask 30, and a chip 40. The chip 40 has solder bumps 15 thereon. The chip 40 is bonded to the substrate 10 via the bonding of the solder bumps 15 and the bump pads 20. The substrate 10 further comprises solder balls 17 or pins (not shown) used to electrically connect other devices. An underfill material 50 is formed between the chip 40 and the substrate 10 to protect the connection of the solder bumps 15 and the bump pads 20 from being contaminated and consolidate the connection.

The solder mask 30 covers the circuit traces 25 in order to avoid short circuit induced by overflow of the solder bumps 15. The solder mask 30 has a plurality of openings smaller than the bump pads 20 to expose the bump pads 20. However, since the bump pads 20 must have additional space in peripheral areas to tolerate the misalignment of the solder bumps 15, the margin space between adjacent bump pads 20 would be limited. Therefore, the number of circuit traces passing the margin space is also limited. Furthermore, for NSMD packages, the openings of solder mask are larger than bump pads and more margin space between adjacent bump pads would be needed to tolerate the misalignment of the solder bumps so that the number of circuit traces passing the margin space is also limited. Thus the conventional flip chip package structures set forth would not meet the requirement of size minimization due to the limited density of circuit layout.

Moreover, the processes for forming solder mask including photolithography and etching process increase complexity and production cost of package process. The misalignment of solder mask further degrades quality of integrated circuit package structures. The weak bonding between applied underfill material and the solder mask could result cracks and peeling off of the solder mask, and degrade the reliability of integrated circuit package structures.

SUMMARY OF THE INVENTION

It is therefore an object of the invention to provide a high density integrated circuit flip chip packages and the method for forming the same without using solder masks to increase the reliability and integration.

It is another object of this invention to provide a high density integrated circuit flip chip packages and the method for forming the same to upgrade substrate production yield and reduce production cost.

It is another object of this invention to provide a high density integrated circuit flip chip packages and the method for forming the same which utilize molding underfill to cover a substrate and chips and protect circuit traces around the edge of the substrate.

To achieve these objects, and in accordance with the purpose of the invention, the invention provides a high density integrated circuit flip chip packages and the method for forming the same. First of all, traces and a plurality of solder pads with solder wettability are formed on a surface of a substrate simultaneously, wherein a height of the traces equals to a height of the solder pads. Before adhering solder bumps of the chip to the bump pads, the solder bumps are dipped by a flux at first and then the chip is connected to the substrate by using a flip-chip mode to avoid over-wetting defects in the reflow process. Finally, the substrate and the chip are covered by using molding underfill to protect traces directly.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow and structures. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
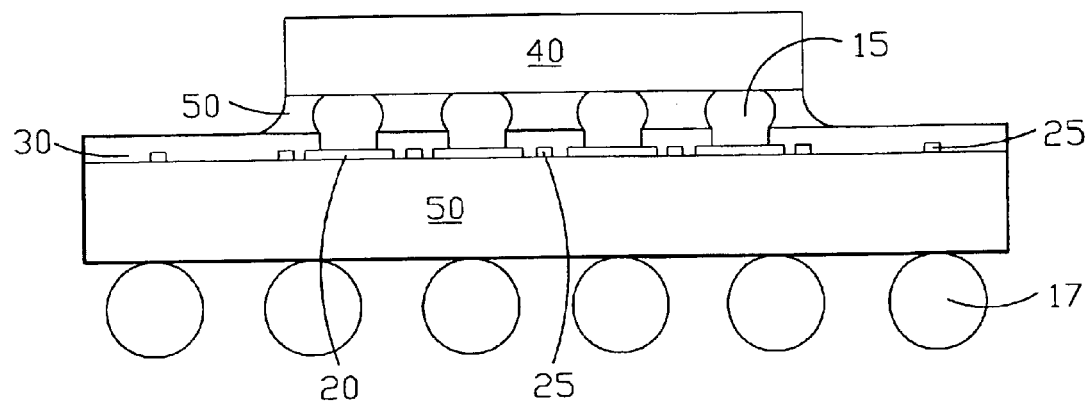
FIG. 1 shows the result of mounting a chip on a substrate with solder mask.
Figure 2:
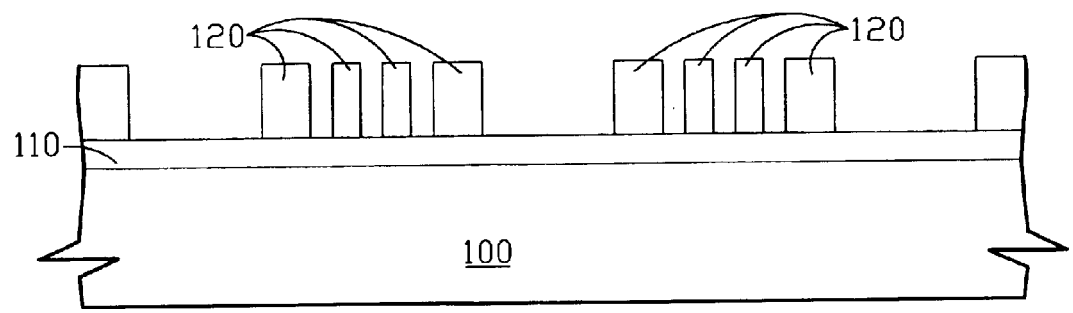
FIG. 2 shows the result of forming a first metal layer on the substrate and then forming a patterned photoresist on the first metal layer.

The invention provides a high density integrated circuit flip chip packages and the method for forming the same. FIG. 2 to FIG. 10 show one embodiment of this invention. An integrated circuit substrate 100 having circuits is provided, and a patterned metal layer is formed thereon. The following steps form fine circuits on the substrate to increase the density of circuit layout on the substrate. Referring to FIG. 2, a first metal layer 110 is formed on the substrate 100. The first metal layer 110 comprises copper, copper alloy or other metal according demands of product. To meet the requirements of the successive processes, the thickness of the first metal layer 110 should be less than 5 micron meter. Then a photoresist layer 120 is formed and patterned on the first metal layer 110 to expose portions of the first metal layer 110 to define circuit traces and bump pads.

Figure 3:
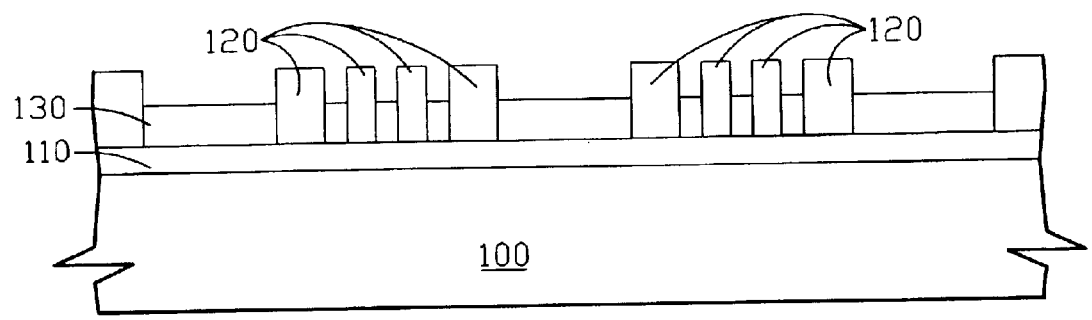
FIG. 3 shows the result of forming a second metal layer on the exposed first metal layer.

Referring to FIG. 3, a second metal layer 130 is formed on the exposed first metal layer 110 to increase the thicknesses of circuit traces and bump pads. The second metal layer 130 comprises the same material with the first metal layer 110 such as copper or copper alloy formed by electroplating. The thickness of the second metal layer 130 depends on demands of product and process. The second metal layer 130 can also be omitted.

Figure 4:
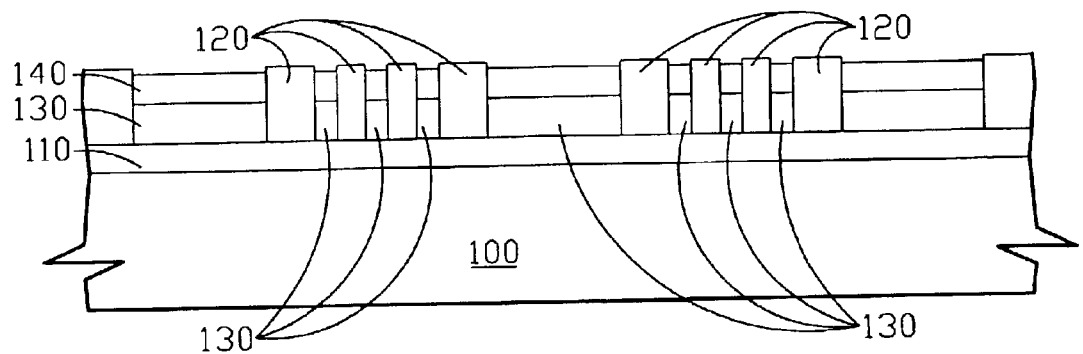
FIG. 4 shows the result of forming a third metal layer on the second metal layer.

Referring to FIG. 4, a third metal layer 140 is formed on the second metal layer 130. The third metal layer 140 comprises metal materials with solder wettability such as nickel/gold, tin/lead, lead, palladium, silver or tin etc. formed by electroplating. The thickness of the third metal layer 140 depends on requirements of product and process.

Figure 5:
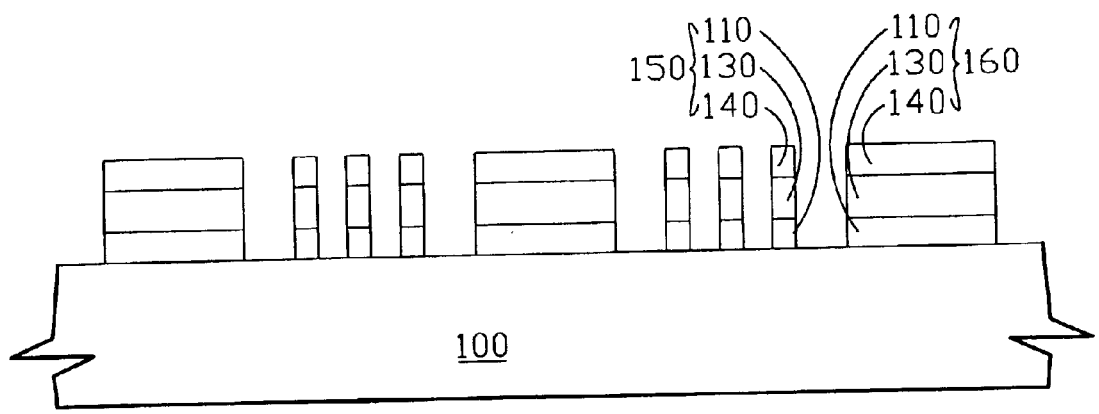
FIG. 5 shows a result of removing the photoresist layer and etching the first metal layer.

Referring to FIG. 5, the photoresist layer 120 is removed and the first metal layer 110 is etched by using the second metal layer 130 and third metal layer 140 as etching mask to form a patterned metal layer on the surface of the substrate 100. A portion of the patterned metal layer is used as circuit traces 150 of the substrate 100, and another portion of the patterned metal layer is utilized as bump pads 160 to connect chips. The circuit traces 150 and the bump pads 160 are formed simultaneously so that the circuit traces 150 and the bump pads 160 comprise the same material and have the same thickness. The circuit layout of the substrate is formed without using solder mask which is applied in conventional process.

After the circuit traces 150 and the bump pads 160 are formed on the substrate, a release film can be formed on the substrate to protect the substrate from contamination and scratch during transportation and process. The release film can be ripped off from the substrate easily. After a simple clean step to remove residual glue, the substrate can be processed further.

Figure 6:
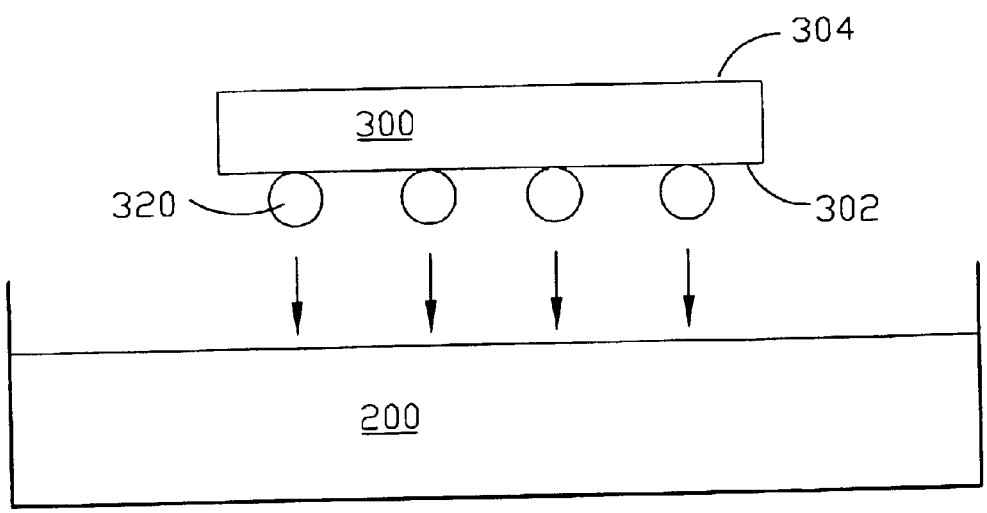
FIG. 6 shows the bumps of a chip dipped by a flux.

Referring to FIG. 6, a chip 300 having a first surface 302 and a second surface 304 is provided. The second surface 304 is an active surface and has solder bumps 320 thereon. A clean process can be performed on the contact surfaces of the substrate 100 and the chip 300 to clean the surfaces of the solder bumps 320 and bump pads 160 and remove natural oxide. A flux 200 can be applied onto the solder bumps 320 before the bonding of solder bumps 320 and the bump pads 130. The flux 200 comprises a solution with deoxidation ability and low wettability.

After applying the flux 200 on the solder bump 320, the natural oxide on the surface of the solder bump 320 can be removed during the bonding process. After the bonding of the solder bumps 320 and the bump pads 160, the flux 200 can also remove the natural oxide on the surface of the bump pads 160 so that the solder bumps 320 and the bump pads 160 can be bonded more easily. By adjusting viscosity, rheology and wettability of the flux 200, the flux 200 could distribute on the bump pads 160 only and would not overflow to the circuit traces 150. The circuit traces 150 still have natural oxide on the surface. Therefore, short circuit of the circuit traces 150 stemming from the overflow of the solder bumps 320 can be avoided during the reflow step of the solder bumps 320. Before the solder bumps 320 are bonded to the bump pads 160, the following steps can be optionally performed depending on the requirements of process and product. First, a clean process can be performed on the surfaces of the solder bumps 320 and the bump pads 130. Second, the flux 200 is applied on the surfaces of the solder bumps 320. Instead, the surfaces of the solder bumps 320 and the bump pads 160 are cleaned first, and then the flux 200 is applied on the surfaces of solder bumps 320 before the solder bumps 320 are bonded to the bump pads 160.

Figure 7:
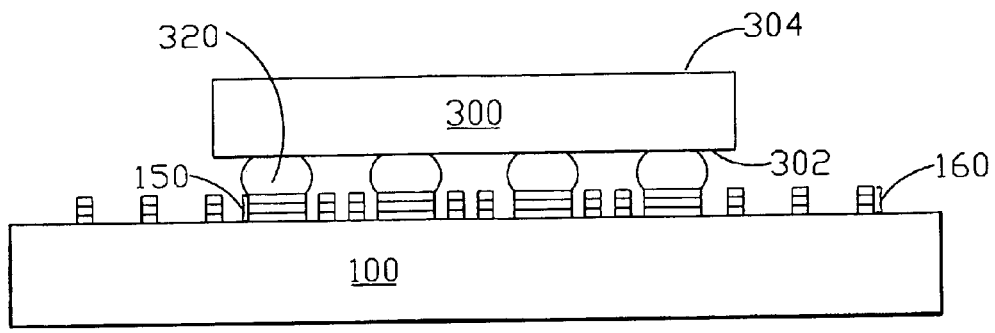
FIG. 7 shows the result of bonding the chip to the substrate.

Referring to FIG. 7, the chip is bonded to the substrate. The chip 300 is mounted on and electrically connected to the substrate 100. The solder bumps 320 of the first surface 302 of the chip 300 are used to connect the bump pads 160 of the substrate 100 to mount the chip 300 on the substrate 100. Each solder bump 320 corresponds to a bump pad 160 and is mounted by a reflow process. The surfaces of the solder bumps 320 and the bump pads 160 are deoxidized without oxide coverage while the surfaces of the circuit traces 150 have oxide coverage so that the solder bumps 320 and the bump pads 160 can be easily bonded without short circuit between the chip and the circuit traces 150 resulting from solder overflow.

Since the bonding of the solder bumps 320 and the bump pads 160 dose not use any solder mask in this invention, misalignment would not present. Therefore, the process efficiency can be increased, and the production cost can be reduced. Because the height of the circuit traces equals to the height of the bump pads and no solder mask is used, conventional presolderings or minibumps which are utilized to raise the height of the bump pads are not necessary. Moreover, since the circuit traces and the bump pads are formed simultaneously, the production process can be simplified.

Figure 8:
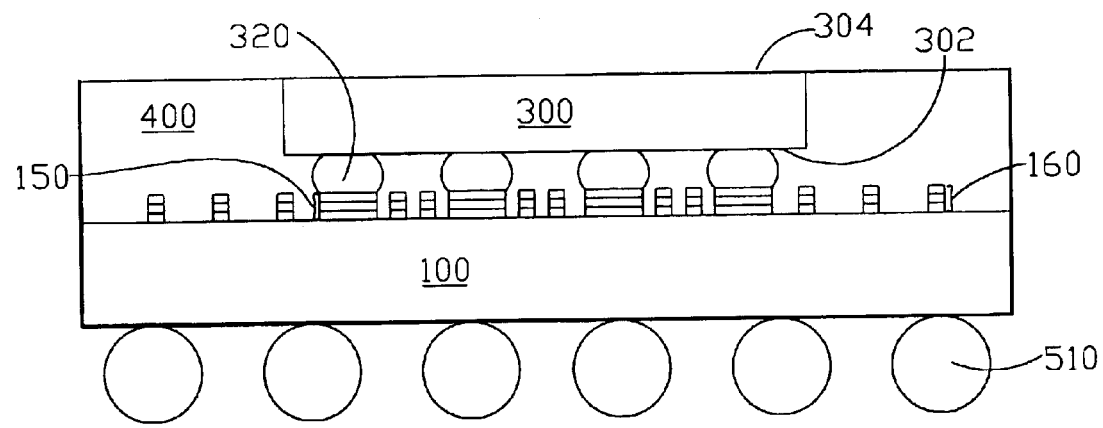
FIG. 8 shows one package structure of this invention.
Figure 9:
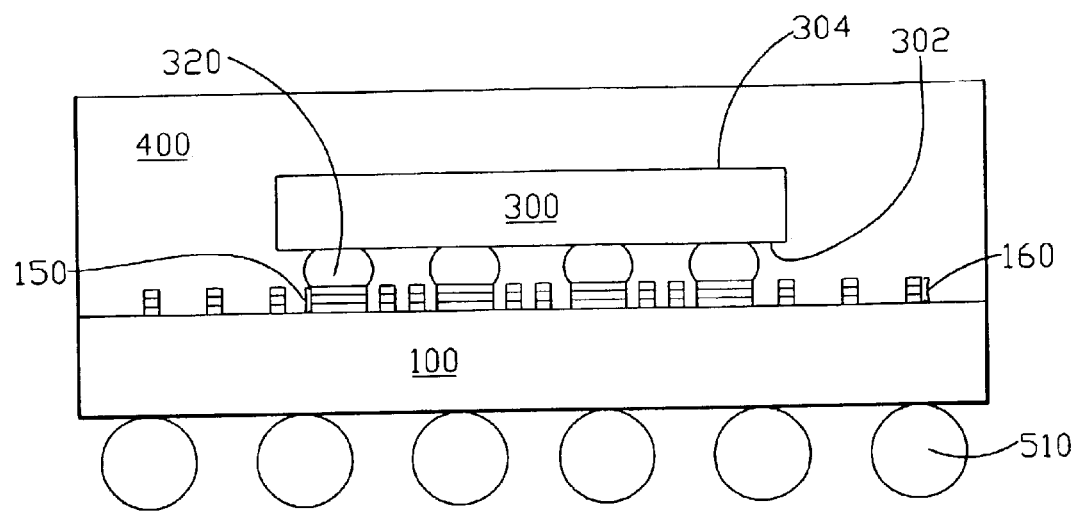
FIG. 9 shows another package structure of this invention.
Figure 10:
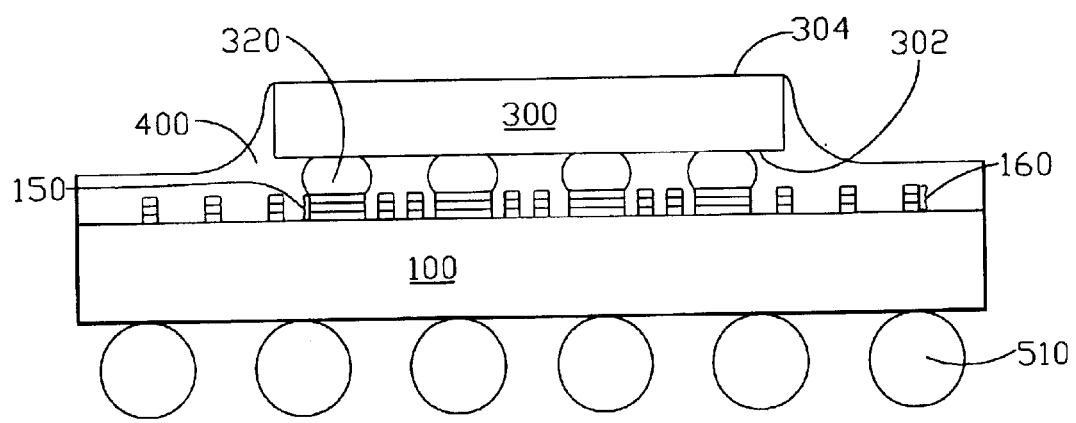
FIG. 10 shows another package structure of this invention.

Referring to FIG. 8 to FIG. 10, various package structures of this invention are shown. After the chip 300 is mounted on the substrate 100, a molding underfill material 400 is applied between the chip 300 and the substrate 100. The molding underfill material 400 covers the substrate 100 and the circuit traces 150 and fills the space between the chip 300 and the substrate 100. Referring to FIG. 8, the non-active surface 304 of the chip 300 is exposed without the coverage of the molding underfill material 400. Referring to FIG. 9, the molding underfill material 400 completely encapsulates the chip 300. Referring to FIG. 10, the thickness of the molding underfill material 400 on the non-chip regions is thinner. Solder balls 510 or pins can be formed on the bottom of the substrate 100 to connect other devices. The solder balls 510 shown in FIG. 8 to FIG. 10 are merely examples, not a limitation to the scope of this invention.

Since solder mask is not applied, no additional space on the peripheral region of bump pads is needed, and more circuit traces can be arranged between two bump pads. Therefore, the size of integrated circuit package structure can be reduced and more circuit traces can be included to increase the performance and stability of integrated circuit package structure. The invention provides a high density integrated circuit flip chip packages and the method for forming the same. The integrated circuit flip chip packages and the method for forming the same of this invention can increase circuit integration, reliability, yield ratio and production efficiency. The integrated circuit flip chip packages and the method for forming the same of this invention can also reduce production cost.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. An integrated circuit flip chip package structure, said package structure comprising:

an integrated circuit package substrate having a first surface and a second surface;

a plurality of circuit traces on said first surface of said integrated circuit package substrate;

a plurality of bump pads on said first surface of said integrated circuit package substrate formed simultaneously with said circuit traces, said bump pads and said circuit traces having a same height and formed of a same material;

at least one chip having a plurality of solder bumps on an active surface thereof, said solder bumps corresponding and bonding to said bump pads; and a molding underfill material covering said integrated circuit package substrate and said circuit traces and filling between said integrated circuit package substrate and said chip.

2. The integrated circuit flip chip package structure according to claim 1, wherein said circuit traces and said bump pads are formed of copper.

3. The integrated circuit flip chip package structure according to claim 1 further comprising a solder wettable metal material covering said circuit traces and said bump pads.

4. The integrated circuit flip chip package structure according to claim 1 further comprising a plurality of solder balls on said second surface of said integrated circuit package substrate.

5. The integrated circuit flip chip package structure according to claim 1 further comprising a plurality of pins on said second surface of said integrated circuit package substrate.

6. The integrated circuit flip chip package structure according to claim 1, wherein said molding underfill material further encapsulates said chip.

7. The integrated circuit flip chip package structure according to claim 1, wherein an non-active surface of said chip is exposed without the coverage of said molding underfill material.

* * * * *